United States Patent [19]

Steiner

[11] Patent Number: 5,083,086
[45] Date of Patent: Jan. 21, 1992

[54] DIFFERENTIAL ARC REFLECTOMETRY

[75] Inventor: James P. Steiner, Royersford, Pa.

[73] Assignee: James G. Biddle Co., Blue Bell, Pa.

[21] Appl. No.: 552,251

[22] Filed: Jul. 12, 1990

[51] Int. Cl.$^5$ ............................................. G01R 31/11
[52] U.S. Cl. ................................. 324/533; 324/534; 324/644; 379/26
[58] Field of Search ............... 324/533, 534, 536, 644; 379/26

[56] References Cited

U.S. PATENT DOCUMENTS

| | | | |
|---|---|---|---|
| 4,291,204 | 9/1981 | Crick | 324/534 |
| 4,491,782 | 1/1985 | Bellis et al. | |
| 4,649,335 | 3/1987 | Lassaux | 324/534 |
| 4,859,951 | 8/1989 | Cole | 324/534 |

FOREIGN PATENT DOCUMENTS

| | | | |
|---|---|---|---|
| 203296 | 4/1956 | Australia | 324/533 |
| 0006005 | 12/1979 | European Pat. Off. | 324/534 |
| 1360590 | 7/1974 | United Kingdom . | |
| 2082866 | 3/1982 | United Kingdom | 324/534 |

OTHER PUBLICATIONS

"Time-Domain Reflectometry for Monitoring Cable Changes", Steiner, J. P., Weeks, W. L., EPRI Final Report, EPRI GS-6642-Feb. 1990.
"Development of a Current Detection Type Cable Fault Locator", Komoda, M., Kawashima, T., Arakane, M., Aihara, M., Fujiwara, Y., Conference Record 90 WM 248-5 PWRD, IEEE Winter Power Meeting, Atlanta, Ga., Feb. 1990.
EPRI Report TD-153: "Evaluation of Underground Fault Location Techniques", Apr. 1976.
Schwarz: "Fault Location in Underground Cable"—IEEE PES Meeting—Jul. 1975.
Widrow: "Adaptive Signal Processing"—Prentice Hall—1985—Ch. 9.

*Primary Examiner*—Kenneth A. Wieder
*Assistant Examiner*—Jose M. Solis
*Attorney, Agent, or Firm*—Dann, Dorfman, Herrell and Skillman

[57] ABSTRACT

Location of a fault in electrical conductors from a terminal position which may be remote from the fault using at least a broad band pulse generator to generate a pulse at a terminal position. It also uses a voltage source at the terminal position capable of inducing a change of impedance at the fault and time measuring means also at the terminal position. The method involves generating a first pulse at the terminal position which is propagated down the conductor and reflected back to the terminal position from various impedance discontinuities, including the impedance discontinuity of the fault, if present. The pattern of reflections from points along the conductor up to the fault resulting from the first pulse are recorded. Then sufficient voltage is applied to the cable to induce a change in impedance at the fault. Simultaneously a second pulse similar to the first is generated at the terminal position and reflected back from the various impedance discontinuities, including the modified impedance discontinuity at the fault. The reflections of the first pulse are then substracted from the reflections of the second pulse leaving the pulse reflected from the fault. The location of the fault is then determined from the time taken from initiation to reflection of the pulse to the terminal position.

5 Claims, 5 Drawing Sheets

DIFFERENTIAL ARC REFLECTOMETRY

INTRODUCTION

The present invention is concerned with a calibration method and its associated system for performing necessary mathematical manipulation. The method combines a fault location technique known as the Arc Reflection Technique (ART) with Differential Time Domain Reflectometry (DTDR) to circumvent problems associated with fault location. The combined technique is referred to as the Differential Arc Reflection Test (DART) and is superior to either ART or DTDR for locating faults in cable systems.

BACKGROUND OF THE INVENTION

When a cable develops a fault, an impedance discontinuity sometimes develops at that point in the cable. A technique, referred to as time domain reflectometry (TDR) is often used as one of the fault location methods. In this method, the TDR instrument is connected to the cable under test which applies a broadband, low voltage pulse to the cable. This pulse travels along the cable until it encounters an impedance discontinuity. When describing the phenomena of traveling waves in a cable system the cables are often specified in terms of their characteristic impedance, $Z_0$, and their velocity of propagation, $v_0$. If the fault's impedance discontinuity, $Z_1$, is substantially different from $Z_0$ then part of the pulse is reflected from the discontinuity and travels back to the instrument where it can be observed by the operator. This reflected pulse behaves much like an echo. The operator knows the time, $T_1$, when the pulse was launched and can measure the arrival time, $T_2$, of the reflected pulse. The location of the impedance discontinuity can be calculated as:

$$L = \frac{v_0}{2} [T_2 - T_1] \quad (1)$$

The factor of two appears because the pulse must travel to the impedance discontinuity and back. The amplitude of the reflected pulse depends on the magnitude of the impedance discontinuity. Assuming that the amplitude of the pulse applied to the cable is one volt and the impedance discontinuity, $Z_1$, is a resistive shunt element, then the reflected pulse will have an amplitude equal to the reflection coefficient, $\rho_1$, which is given by:

$$\rho_1 = \frac{-Z_0}{2 Z_1 + Z_0}$$

In practice impedance discontinuities resulting in reflection coefficients having magnitudes less than 0.1 are difficult to identify. Faults with reflection coefficients in the range of $-1.0$ to $-0.1$ are referred to as bolted faults and are usually detectable using TDR.

Locating faults in cables using TDR is often unsuccessful because an impedance discontinuity (short circuit) is only present while operating voltages are applied to the faulted cable. This type of fault is referred to as a high impedance fault and without operating voltages applied the cable appears functional. A method referred to as the arc reflection test (ART) circumvents this difficulty by simultaneously applying TDR pulses and operating level voltages. When operating level voltages are applied to the faulted cable an arc forms at the fault site. The arc has an extremely low impedance which causes the reflection coefficient to be nearly $-1$ at the fault site. While the fault is arcing TDR pulses are applied to the cable and the fault is easily identified because the reflection is strong. Often this technique is not successful with bolted faults because the change in the fault impedance (reflection coefficient) is small during the time that the arc is present and the operator cannot discern this change.

Both of the aforementioned techniques use TDR as a basis and TDR measurements are often difficult to interpret. Typical cables have other impedance discontinuities distributed along their length which have reflection coefficients large enough to mask the presence of the reflection from the fault. Unshielded multiconductor cables and direct buried cables with corroded neutral conductors are two notable examples where the other background reflections can potentially mask the desired reflection. Another important example is a branched cable system that has multiple cables tapped from it along its length.

A new TDR technique has recently become available and is referred to as differential TDR (DTDR). This technique allows the operator to remove nuisance reflections from the measurements. The basic idea is to use a TDR to measure the background scattering function of the cable and use it as a calibration signature of the cable to correct the measurements. The background scattering function is a signature of all the "background" discontinuities along the length of the cable under test which is usually referred to as clutter. The received, background scattering function, $R_{bkgd}(t)$, can be represented, using a first order model, as $$R_{bkgd}(t) = \sum_{i=1}^{N} \rho_i S(t - T_i)$$

where $S(t)$ is the pulse that is applied to the cable, $\rho_i$ is the reflection coefficient of the $i^{th}$ impedance discontinuity, $T_i$ is the round-trip time delay to the $i^{th}$ impedance discontinuity and N is the number of significant reflectors along the cable. The DTDR technique is meant to be used in situations where a preexisting calibration for the cable is stored in an archive or where the operator has complete access to all parts of the system. Archives of the cable discontinuities often do not exist which limits the applicability of the archival technique. In the absence of an archive the DTDR technique finds its greatest use in tests where the operator determines the response of the system to a physical change made at some point in which there is interest. This physical change modifies the impedance at that point and thus the reflection coefficient. The operator then repeats the same measurement. The new measurement contains the same information as the background scattering function but also contains the reflection due to the physical change. The new received signal, $R_{new}(t)$, has the form $$R_{new}(t) = \rho_j S(t - T_j) + \sum_{i=1}^{N} \rho_i S(t - T_i)$$

where $\rho_j$ is the reflection coefficient due to the physical change in the system and $T_j$ is the round-trip time delay to the point in the system where the change was made. The background scattering function, $R_{bkgd}(t)$, is subtracted from the new measurement, $R_{new}(t)$, which leaves as a residual the reflection from the impedance discontinuity of interest. The residual, $R_{res}(t)$, is given by $$R_{res}(t) = R_{new}(t) - R_{bkgd}(t) = \rho_j S(t - T_j)$$

which is the desired result. Knowledge of the "background" discontinuities enables one to use signal processing to remove the clutter masking the desired reflection. Under the proper conditions reflection coefficients with magnitudes of 0.0001 can be easily detected. The drawback to this technique is that it requires that the operator have access to the physical location in the system in which he is interested so that a physical change (change in impedance) can be made at that point.

Nature of the Present Invention

The new technique, Differential Arc Reflection Test (DART), combines two recognized fault location methods, TDR and ART, with the DTDR calibration technique to yield a nonambiguous measurement of the fault location, even in the presence of heavy clutter. The technique is similar to DTDR except that the impedance discontinuity at the fault site is changed by inducing an arc at the fault site by applying the necessary voltage to the cable. Normal usage of DTDR would require that the operator have access to the fault site to make an impedance change which implies that the location of the fault is already known. The DART technique induces the impedance change from the terminal of the cable.

As in the DTDR method the background scattering function of the faulted cable is measured without normal operating voltage levels applied to the cable. The received signal, $R_{bkgd}(t)$, is represented, using a first order model, as $$R_{bkgd}(t) = \sum_{i=1}^{N} \rho_i S(t - T_i)$$

where $S(t)$ is the pulse that is launched into the cable, $\rho_i$ is the reflection coefficient of the $i^{th}$ impedance discontinuity, $T_i$ is the round-trip time delay to the $i^{th}$ impedance discontinuity and N is the number of significant reflectors along the cable up to the point of the fault. Only reflectors up to the location of the fault are used in this description because they are the only reflectors that influence the results.

A voltage sufficient to induce arcing at the fault is applied to the cable under test. Simultaneously to the voltage application TDR pulses are applied to the cable. The new measurement contains the same information as the background scattering function but also contains the reflection due to the low impedance at the fault. The new received signal, $R_{new}(t)$, has the form $$R_{new}(t) = -S(t - T_j) + \sum_{i=1}^{N} \rho_i S(t - T_i)$$

where the reflection coefficient is assumed to be $-1$ at the fault site and $T_j$ is the round-trip time delay to the fault site.

The background scattering function, $R_{bkgd}(t)$, is subtracted from the new measurement, $R_{new}(t)$, which leaves as a residual the reflection from the fault site. The residual, $R_{res}(t)$, is given by $$R_{res}(t) = R_{new}(t) - R_{bkgd}(t) = -S(t - T_j) \qquad (2)$$

which is the desired result. The delay time, $T_j$, is then converted into the fault location by applying Eq. 1 as previously discussed. Knowledge of the background discontinuities enables one to use signal processing to remove the clutter masking the reflection from the fault.

The above analysis applies only to reflections returning to the instrument up to and including time $T_j$. The residual signal resulting from the DART technique will be zero up to the time $T_j$ and will contain undetermined returns after that time. There are two reasons for this behavior of the residual. When the arc forms very little pulse energy travels past the fault impedance and the received signal does not contain any of the background scattering function past the fault. Also, other, new, multiple reflections result from the introduction of the new impedance discontinuity (the arc) but these reflections arrive at the instrument at a later time than $T_j$. These extraneous returns do not influence the results since one is only interested in the return occurring at $T_j$; the return at $T_j$ is completely unmasked from clutter. For these reasons one is only interested in the first significant return in the residual, $R_{res}(t)$.

This technique also applies to bolted faults in cables. If sufficient energy is applied to the cable under test, the current through the fault begins to heat the fault impedance changing its impedance slightly. This small change in impedance is easily detectable using DART with the amplitude of the result equaling the difference in the impedance before and during the arc. The residual, $R_{res}(t)$, will have the form $$R_{res}(t) = -\Delta\rho_j S(t - T_j)$$

where $\Delta\rho_j$ is the change in the reflection coefficient at the fault site.

The Invention

More specifically the method of the present invention relates to determining the location of a fault in electrical conductors from a terminal position which may be remote from the fault using at least a broadband pulse generator to generate a pulse at the terminal position, a voltage source at the terminal position sufficient to induce a change of impedance at the fault site and time measuring means also at the terminal position. At least the following steps are involved: generating a first pulse at the terminal position to be propagated down the conductor and reflected back to the terminal position from various impedance discontinuities including the impedance discontinuity at the fault, if present; recording the pattern of the reflections from points along the conductor with the fault resulting from the first pulse; applying sufficient voltage to induce a change in impedance at the fault and simultaneously generating a second pulse, similar to the first, at the terminal position to be propagated down the conductor and reflected back to the terminal position from the various impedance discontinuities up to the fault and from the modified impedance discontinuity at the fault; subtracting the reflections from the first pulse from the reflections of the second pulse and determining from the remaining major reflections, the location of the fault. The method is preferably practiced using the formula in Eq. 2 as previously described.

The fault location apparatus of the present invention includes at least a broadband pulse generator for generating a pulse at a terminal of an electrical conductor to be tested and a voltage source capable of producing a momentary impedance change at the fault site from the terminal position. A filter is used to separate the voltage inducing the change in impedance at the fault to be located from the broadband time domain reflectometry pulse. Means are provided to record the pulse reflections digitally from points along the electrical conductor and to eliminate by subtraction pulse reflections other than the different pulses generated by the change in impedance at the fault to be located. Means are provided to calculate the time between the pulse initiated by the pulse generator and a pulse to be received back from the fault.

SPECIFIC DESCRIPTION OF THE INVENTION

Figures 1, 1A:
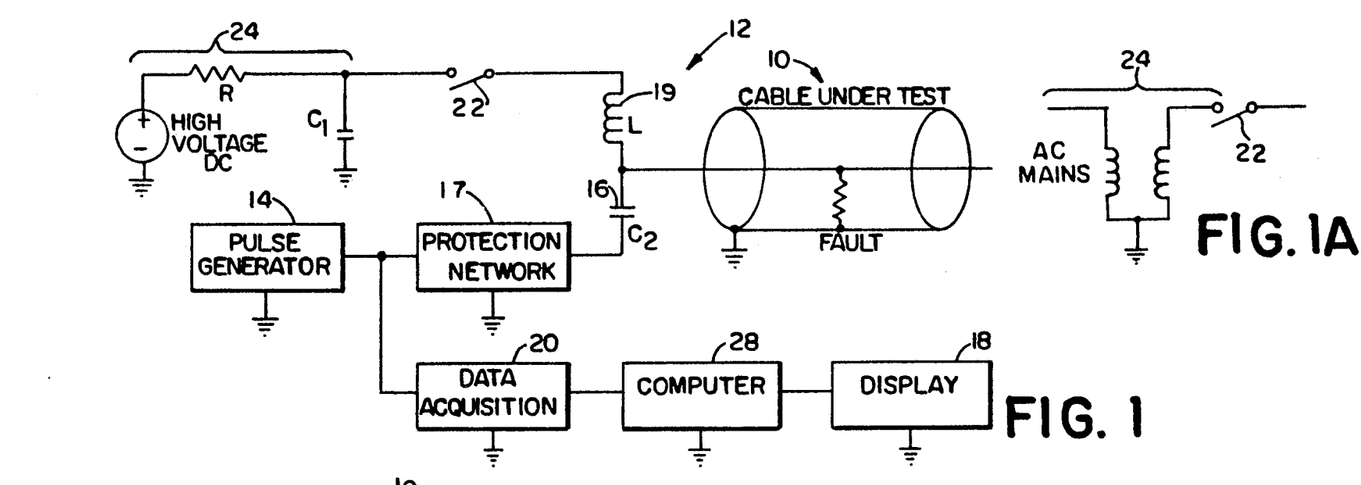
FIG. 1 is a schematic block diagram which represents a system of apparatus in performing the method of the present invention.
FIG. 1A shows an alternative power source to be substituted into the system in FIG. 1 and is used to deliver a large, continuous current to the fault impedance for the purpose of detecting bolted faults.

Referring now to FIG. 1 a cable under test 10 is shown grounded and connected to the apparatus 12 of the present invention. The apparatus consists of a broadband pulse generator 14 having a low frequency isolation means 16 and protection means 17 interposed between the pulse generator and the cable under test 10. The pulse generator 14 produces a broadband pulse which travels along the cable conductor. Various impedance discontinuities produce a series of reflections which may be observed sequentially on a display monitor 18, and may appear as in FIG. 4. This signal is simultaneously recorded at data acquisition 20, consisting of an analog to digital conversion means. The signal is stored in computer 28 with suitable memory means and means to identify and reconstruct the reflected signals produced by a particular pulse from pulse generator 14.

Figure 5:
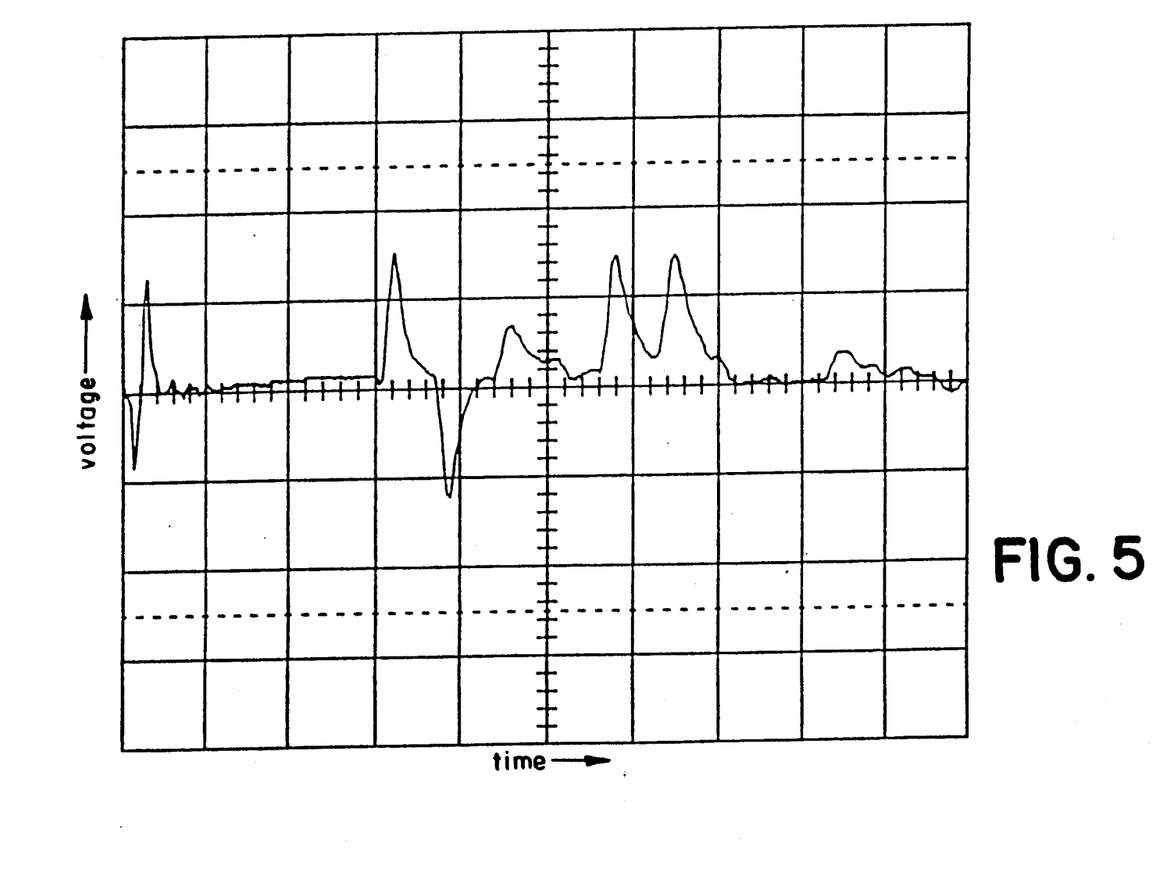
FIG. 5 is a graph of the new scattering function, $R_{new}(t)$, of the cable system in FIG. 2 and shows similar reflections from the impedance discontinuities along the same conductor generated by a similar pulse, but in the presence of a voltage sufficient to generate an arc or other distinguishing change of impedance at the fault to be located.
Figure 6:
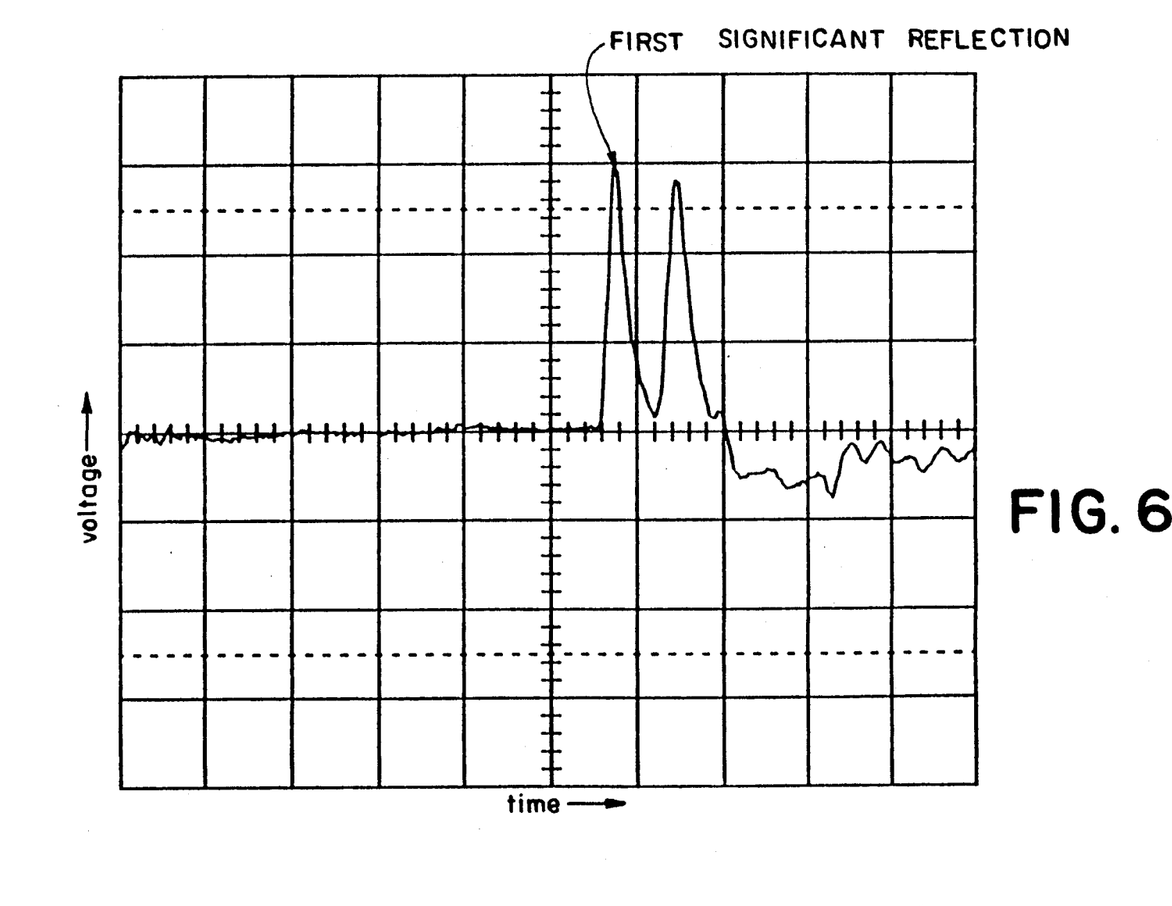
FIG. 6 is a differential arc reflectograph, $R_{res}(t)$, formed by subtracting the pulses of FIG. 4 from those of FIG. 5 leaving the differential pulses due to reflections from the impedance changed by the applied voltage.

Switch means 22 is provided in a line connecting a voltage source 24 having a high frequency isolation means 19 to the line. The voltage source is sufficient to produce a change in impedance at the fault whose location is being sought. This may occur as an arc, current flow or other transient discharge, which occurs when a voltage, rated voltage or a specified voltage over rated voltage is applied through the closing of switch 22. While switch 22 is closed the pulse generator is used to generate essentially the same pulse which generated the reflected signals in FIG. 4. In this instance the pulse produces the reflected signals of FIG. 5. This signal is simultaneously recorded at data acquisition 20 and stored in computer 28. A computer 28, signal processor or comparator is employed to subtract the signal of FIG. 4 stored in the computer 28 from the signal of FIG. 5 also stored in computer 28. The result of this comparison is subtraction of the signal of FIG. 4 from that of FIG. 5 to produce the signal of FIG. 6, isolating the signal produced by a change of impedance at the fault, which differential signal may be displayed at the display monitor 18 and stored in the computer 28. The computer 28 and data acquisition 28 have timing means to calculate effectively the time between the initial pulse and the pulse produced by the net reflection at the fault seen in FIG. 6. From the time and the cable characteristics it is then possible to calculate the distance of the fault from the terminal. This allows the fault to be relatively easily found without undue digging or explorations of cables.

Figure 2:
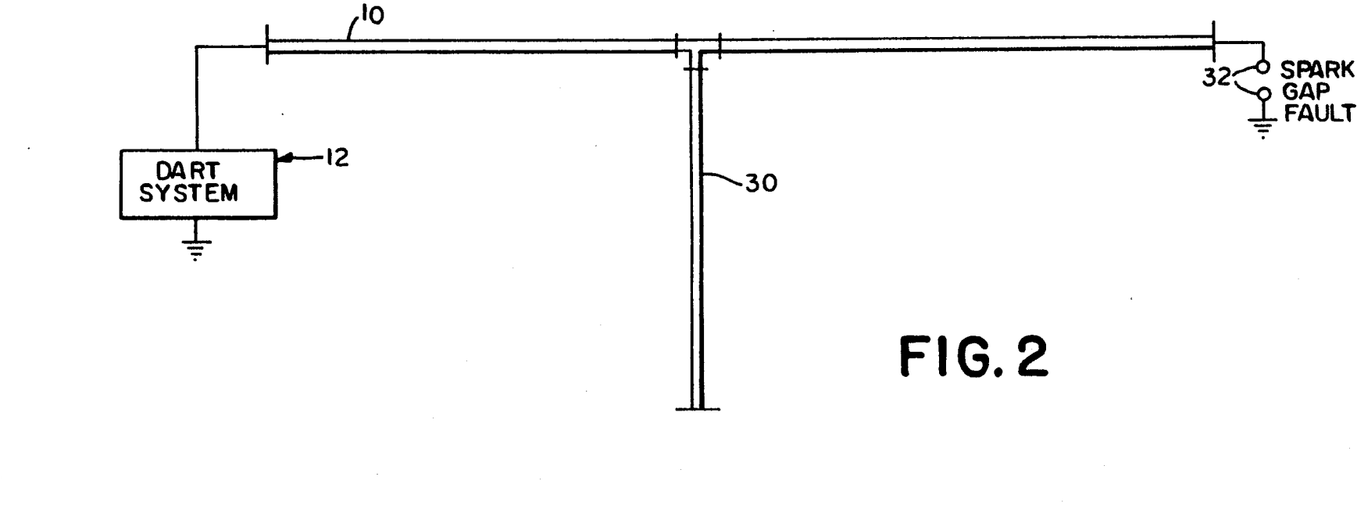
FIG. 2 is a schematic diagram which represents a cable system with a branch and a fault connected to the apparatus of the present invention.
Figure 3:
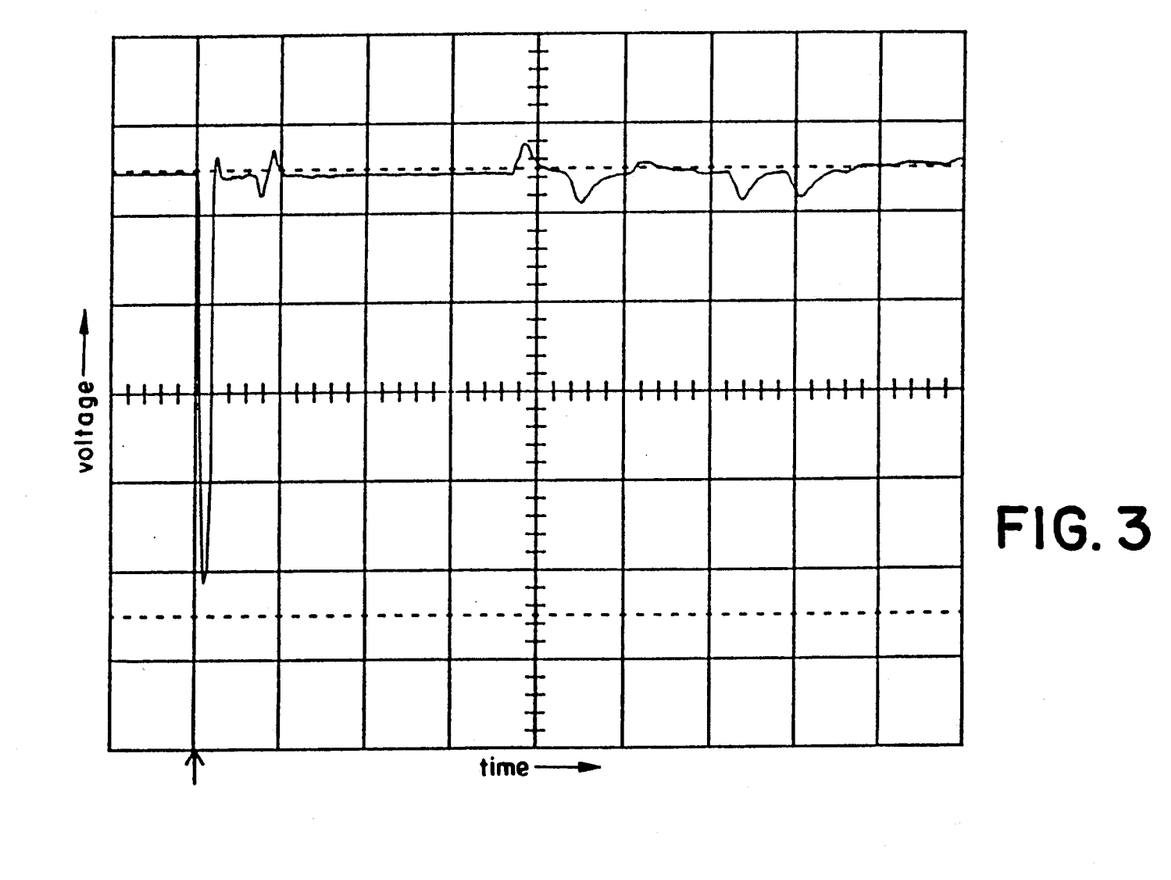
FIG. 3 is a graph of a conventional TDR waveform measured in the system of FIG. 2 and shows reflected pulses generated by a pulse from a broadband pulse generator reflecting from various impedance discontinuities at different distances away from the terminal of the conductor along with the initial pulse applied to the terminal of the conductor.
Figure 4:
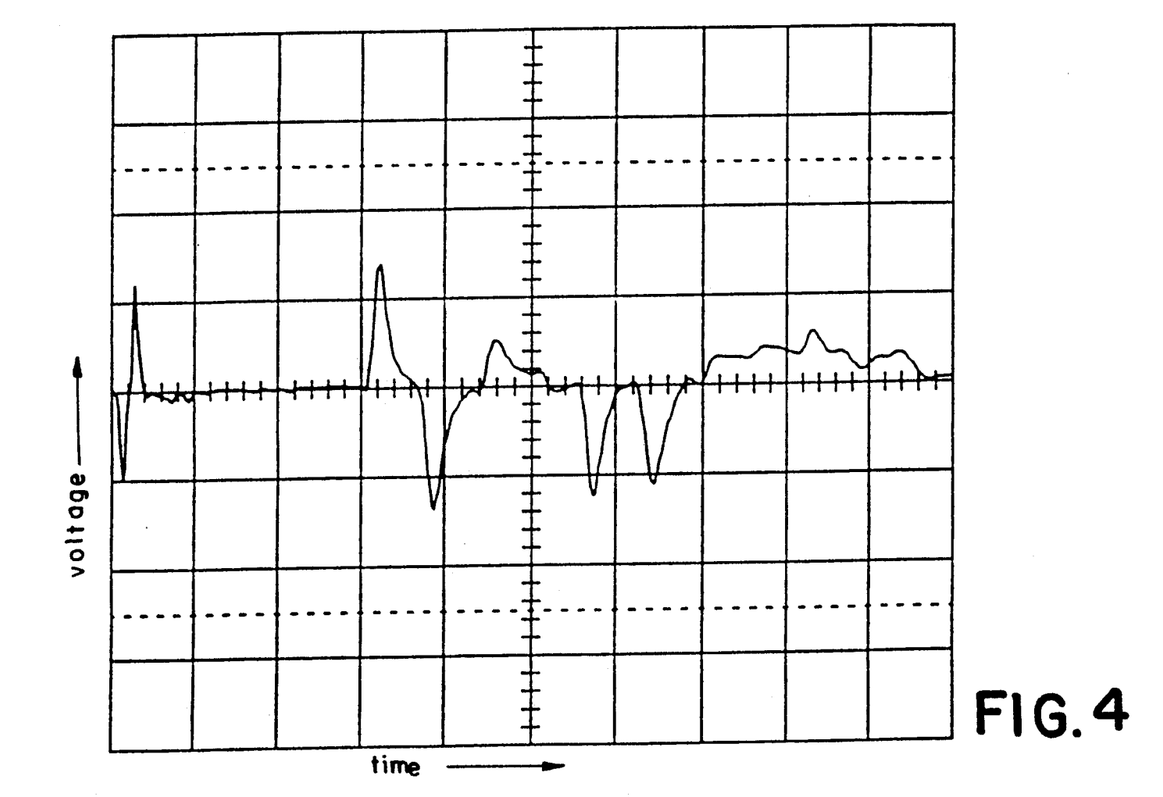
FIG. 4 is a graph of the background scattering function, $R_{bkgd}(t)$, of the cable system in FIG. 2 and shows reflected pulses generated by a pulse from a broadband pulse generator reflecting from various impedance discontinuities at different distances away from the terminal of the conductor without the initial pulse shown.

A prototype DART system, shown in FIG. 2, was constructed and used on a complex cable arrangement to demonstrate its effectiveness. FIG. 1 is representative of the system and its connection to a cable. The physical arrangement of the test cable is shown in FIG. 2. The cable system of FIG. 2 has a branch 30 to complicate the analysis. A fault is simulated using a spark gap 32 at the end of the cable system as shown in FIG. 2. The cable system shown in FIG. 2 has a 961 foot cable preceding the tee and a 837 foot cable following the tee which terminates at the spark gap 32. The branch 30 was 150 feet. As can be seen from FIG. 3, including only one branch makes the interpretation of the TDR display extremely complicated. The first pulse from the left, in FIG. 3, is the TDR input pulse. All subsequent pulses are reflections from discontinuities in the cable system. The following steps were undertaken in making a test:

STEP 1. The first step in the method is to measure the background scattering function, $R_{bkgd}(t)$, of the cable under test. The background scattering function is stored on a computer in a digital format. The measured background scattering function is depicted in FIG. 4 and contains reflections from all the impedance discontinuities in the cable under test. For clarity, the input pulse is not shown in this figure or the figures to follow, if it were shown it would appear to the left of the edge of the figures.

STEP 2. The second step in the method is to repeat the measurement made in step 1 while simultaneously applying an exponentially damped sinusoid having a peak amplitude of 10 kV and fundamental frequency of oscillation near 100 Hz. This new scattering function, $R_{new}(t)$, is stored on the computer in the same digital format as the background scattering function. The scattering function measured in this step is a combination of the same background scattering function measured in step 1 along with the new reflections from the temporary impedance discontinuity created at the fault site by the high voltage. The new scattering function is depicted in FIG. 5. By comparing the scattering functions in FIGS. 4 and 5 it can be seen that they are identical up to the point where reflections from the fault first appear.

STEP 3. The third step of the technique is to take the difference of the background scattering function and the new scattering function. This difference is formed by subtracting the data stored in step 1 from the data stored in step 2. The result is a differential arc reflectograph, $R_{res}(t)$, and is shown in FIG. 6. The reflectograph is essentially zero until the point where reflections from the fault first appear. Only the first significant reflection is important, the subsequent reflections in the reflectograph have no meaningful interpretation and are ignored for the reasons previously discussed.

STEP 4. The fourth step is to calculate the distance to the fault using the stored data. The round-trip time delay to the fault is determined by digitally measuring the time delay between the input pulse and the first significant reflection in the differential arc reflectograph. The distance to the fault is then calculated using Eq. 1.

Generalizations

There are a number of generalizations that can be made concerning the DART method. The experimental system uses a transient voltage to induce the impedance change. Any electrical energy source capable of inducing an impedance change would be suitable. The electrical energy source could be a voltage or current source and could be a dc, ac or transient source.

The previously described first order model for the reflections in the cable system is a gross simplification of an actual cable system with multiple impedance discontinuities. The first order model applies to resistive impedance discontinuities with small magnitudes. There is a second order model that is more accurate but also more abstract. Using the second order model the received background signal, $R_{bkgd}(t)$, can be represented as where S(t) is the pulse that is applied to the cable, * is the convolution operator and, N is the number of significant reflectors $$R_{bkgd}(t) = \sum_{i=1}^{N} \beta_i\left(t; [\beta_k]_{k=1}^{i-1}\right) * S(t)$$

along the cable. The function $$\beta_i\left(t; [\beta_k]_{k=1}^{i-1}\right)$$

describes the reflection from the $i^{th}$ impedance discontinuity and includes all influence of the $i^{th}$ impedance discontinuity on the signal, S(t), and all influences of the previous (i−1) impedance discontinuities on the signal, S(t).

There are two main influences that the previous (i−1) impedance discontinuities will have on the reflected signal. First, as the signal passes through an impedance discontinuity the portion of the signal transmitted past the discontinuity will be distorted. Second, as the signal propagates down the transmission line and encounters multiple discontinuities it will suffer multiple reflections. Both of these effects can be accounted for using the function $$\beta_i\left(t; [\beta_k]_{k=1}^{i-1}\right)$$

which is essentially a linear filter that is dependent on the cascading of other, similar, linear filters.

The new received signal, $R_{new}(t)$, similarly can be represented as $$R_{bkgd}(t) = \sum_{i=1}^{N} \beta_i\left(t; [\beta_k]_{k=1}^{i-1}\right) * S(t) + \beta_j\left(t; [\beta_k]_{k=1}^{N}\right) * S(t)$$

The function $$\beta_j\left(t; [\beta_k]_{k=1}^{N}\right)$$

describes the reflection from the impedance discontinuity at the fault and includes all influence of the fault's impedance discontinuity on the signal, S(t), and all influences of the previous N impedance discontinuities on the signal, S(t). The residual $R_{res}(t)$ is obtained by subtracting $R_{bkgd}(t)$ from $R_{new}(t)$ which leaves a residual $$\beta_j\left(t; [\beta_k]_{k=1}^{N}\right) * S(t)$$

The residual will have its first significant maximum at $T_j$, the round-trip delay time to the fault site.

The first and second order modeling is not necessary for the DART method to be valid. The theoretical basis for the technique lies in a fundamental property possessed by the system under test. The fundamental property is superposition which, in this case, allows one to perform two separate measurements, $R_{bkgd}$ and $R_{new}$, and combine them, algebraically, for the desired result. All cable systems possess this property regardless of the models that are used.

Other generalizations are also possible for the measurement method. The descriptions provided describe an elementary system in which a simple pulse is transmitted and the reflections are received. More advanced measurement techniques are also possible. The general DART method is valid with any method of measuring time delay which has the property of superposition. The superposition property allows one to make two measurements, one without an impedance change at the fault and one with an impedance change at the fault, and then subtract them regardless of the method used to measure the time delay.

Consider one popular approach in which a random or pseudorandom signal is used. In this case, an appropriate function for measuring the time delay would be the time cross-correlation function, $C(\tau)$, defined by where $S_1(t)$ is the transmitted signal and $S_2(t)$ is the received signal due to reflections in the cable as previously defined. In $$C(\tau) = \frac{1}{T} \int_0^T S_1(t) S_2(t + \tau) d\tau$$

this case the residual would be $$C_{res}(\tau) = C_{new}(\tau) - C_{bkgd}(\tau)$$

and the time delay to the fault would be determined from time delay to the first major maximum in $C_{res}(\tau)$.

This can easily be extended to the case where optimal filtering is used. In this case the time cross-correlation function would be defined as $$C(\tau) = \frac{1}{T} \int_0^T [S_1(t) * h_1°(t)][S_2(t + \tau) * h_2°(t)] d\tau$$

where $h_1°(t)$ and $h_2°(t)$ are linear filters chosen to optimize the measurement in some fashion.

In some instances a scattering function measured during the application of the impedance changing voltage can be used as a reference since the reflection coefficient at the fault changes randomly. If two different waveforms are collected while the impedance is changed by the application of a voltage one waveform can be used as the reference, $R_{bkgd}(t)$, while the other is used as the new scattering function, $R_{new}(t)$ This approach is only effective if there is a significant probability that the reflection coefficients at the fault are substantially different during the two measurements.

The invention has been described in terms of a specific configuration of test equipment. It will be understood by those skilled in the art that other configurations are possible within the scope of the invention. All modifications of apparatus and method within the scope of the claims are intended to be within the scope of the present invention.

I claim:

1. The method of determining the location of a fault in electrical conductors from a terminal position which may be remote from the fault using at least a broadband pulse generator to generate a pulse at the terminal position, a voltage source at the terminal position capable of inducing a change of impedance at the fault and time measuring means also at the terminal position, comprising:

generating a first pulse at the terminal position to be propagated down the conductor and reflected back to the terminal position from various impedance discontinuities, including the impedance discontinuity at the fault, if present;

recording the pattern of reflections from points along the conductor up to the fault, resulting from the first pulse;

applying sufficient voltage to the cable to induce a change in impedance at the fault and simultaneously generating a second pulse similar to the first at the terminal position to be propagated down the conductor and reflected back to the terminal position from the various impedance discontinuities up to the fault and from the modified impedance discontinuity at the fault;

subtracting the reflections from the first pulse from the reflections of the second pulse; and determining from the remaining major reflections, the location of the fault.

2. The method of claim 1 in which the pattern of reflections from points along the conductor from the second pulse are also recorded.

3. Apparatus for determining the location of a fault in electrical conductors from a terminal position which may be remote from the fault comprising:

a broadband pulse generator to generator a pulse at the terminal position;

a voltage source capable of producing at least a momentary change of impedance at the fault site;

means to store a reflected signal generated by use of the pulse generator without application of voltage to induce an impedance change at the fault;

means for eliminating the voltage applied;

means to store a similar signal and means to compare and subtract the signal without the impedance changing voltage applied from the signal with the impedance change at the fault generated by the impedance changing voltage;

timing means to initiate timing by a pulse generated by the pulse generator and to terminate timing by a signal left by the difference between the two functions to determine the timing of the round trip delay to the fault; and means to calculate from the time the distance to the fault.

4. The apparatus of claim 3 in which a filter is used to separate the voltage used to induce the change of impedance from the broadband time domain reflectometry pulse; and a digitally implemented time domain reflectometer are employed.

5. Apparatus for determining the location of a fault in electrical conductors from a terminal position which may be remote from the fault comprising:

a signal generator to generate the time domain reflectometry signal at the terminal position;

a means to determine a function which has the mathematical property of superposition and is representative of the time delay between the reflections;

a voltage source of producing at least a momentary change of impedance at the fault site;

means to store the function, representative of the time delay between reflections, without application of the impedance changing voltage;

means for eliminating the voltage applied;

means to store a similar function, representative of the time delay between reflections, and means to compare and subtract the representative function, without the impedance changing voltage applied, from the function, representative of the time delay between reflections, with the impedance changing voltage applied;

timing means to determine the time between the signal applied at the terminal position and the function left by the difference between the two functions to determine the round-trip delay time to the fault; and means to calculate from the round-trip delay time the distance to the fault.

* * * * *